(12) United States Patent
Acharya

(10) Patent No.: US 6,678,708 B1
(45) Date of Patent: Jan. 13, 2004

(54) METHOD AND APPARATUS FOR TWO-DIMENSIONAL SEPARABLE SYMMETRIC FILTERING

(75) Inventor: Tinku Acharya, Chandler, AZ (US)

(73) Assignee: Intel Corporation, Santa Clara, CA (US)

(*) Notice: Subject to any disclaimer, the term of this patent is extended or adjusted under 35 U.S.C. 154(b) by 510 days.

(21) Appl. No.: 09/713,663

(22) Filed: Nov. 15, 2000

(51) Int. Cl.⁷ .............................................. G06F 17/10
(52) U.S. Cl. ...................................................... 708/308
(58) Field of Search ......................................... 708/308

(56) References Cited

U.S. PATENT DOCUMENTS

| | | | | |
|---|---|---|---|---|
| 4,682,301 A | * | 7/1987 | Horiba et al. ............... | 708/308 |
| 5,144,572 A | * | 9/1992 | Awata et al. ................ | 708/308 |
| 5,561,617 A | * | 10/1996 | van der Wal ............... | 708/308 |
| 6,281,933 B1 | * | 8/2001 | Ritter ......................... | 348/447 |
| 6,459,428 B1 | * | 10/2002 | Burk et al. ................. | 345/419 |

* cited by examiner

*Primary Examiner*—David H. Malzahn
(74) *Attorney, Agent, or Firm*—Marger Johnson & McCollom, PC

(57) ABSTRACT

A symmetric digital filter. The filter has the dimensions N rows by N columns. There are a predetermined number of 8-input adders, and a predetermined number of 4-input adders each able to receive inputs from samples of an incoming signal. In addition, there are a predetermined number of parallel multipliers. The parallel multipliers receive output signals from the 8-input adders and the 4-input adders, and multiply the partial sums by coefficients of the digital filter, applying the digital filter to the input signal.

22 Claims, 8 Drawing Sheets

METHOD AND APPARATUS FOR TWO-DIMENSIONAL SEPARABLE SYMMETRIC FILTERING

BACKGROUND

1. Field

This disclosure relates to symmetric digital filtering, more particularly to a method for determining optimal performance of two-dimensional symmetric filtering.

2. Background

The use of digital image data is prevalent. Printing applications, such as making copies, receiving faxes, printing documents, including all kinds of text, graphics and photographs, typically use digital image data. An original image is scanned or image data is provided from a computer, as in computer generated documents. The resulting data is typically a number of data elements, each data element representing a picture element (pixel) of the original image.

The size of the data element depends upon the resolution of the system. A typical printing resolution is 600 dots per inch, where each dot is the equivalent of a pixel. Digital video may have 24 bits per pixel, 8 bits each in red, green and blue. Regardless of how the data is generated, or the resolution in which it is stored, the image data is now in a format that can be manipulated to enhance the quality of the resulting image. The resulting image can be created as a printed image or as a displayed image.

The manipulation of the data can happen through one of several methods. One such method is to apply a filter to the data. Filtering in this instance normally means altering the data values by multiplying or adding some predetermined value to each data element in an image, where the data elements typically correspond to the pixels of the final image. For example, digital image data destined for print applications may have a filter known as a blue noise mask applied to it. The blue noise mask values serve to disrupt any regional patterns in the data that can cause undesirable artifacts in the final image. Two-dimensional digital filtering is used for many other imaging applications such as image enhancement, scaling, and segmentation to name a few but not limited by these applications only.

Image data typically has a native two-dimensional format, having both horizontal and vertical dimensions like the image that data represents. Filtering can be applied in one-dimension, the results stored, and then in the other dimension. This two-step process can be relatively slow and impractical for high-speed printing or real-time display. An alternate approach applies two-dimensional filters, speeding up the process. However, two-dimensional filters require extra hardware to allow for as much parallel processing as possible to take advantage of working in two dimensions simultaneously. A need exists for a technique that provides an optimal filter design for both clock cycles and the amount of hardware required.

BRIEF DESCRIPTION OF THE DRAWINGS

The invention may be best understood by reading the disclosure with reference to the drawings, wherein.

DETAILED DESCRIPTION OF THE EMBODIMENTS

As discussed previously, many digital filtering applications apply one-dimensional (ID) filters. These filters are typically embodied as a series of coefficients used to multiply with the incoming signals. Examples of 3-tap, 5-tap, 7-tap and M-tap filter coefficients (assuming M=2N+1), with the coefficients designated as variables, are shown below:

$$F_3 = [a \ b \ c]$$
$$F_5 = [a \ b \ c \ b \ a]$$
$$F_7 = [a \ b \ c \ d \ c \ b \ a].$$
$$F_N = [F_N \ F_{N-1} \ \ldots \ F_2 \ F_1 \ F_0 \ F_1 \ F_2 \ \ldots \ F_{N-1} \ F_N].$$

Corresponding two-dimensional (2D) separable filters can be derived from these coefficients, as examples, below. The two-dimensional kernel for 3×3 separable symmetric filtering can be derived as $$F_{3\times3} = \begin{bmatrix} a \\ b \\ a \end{bmatrix} * [a \ b \ a] = \begin{bmatrix} a^2 & ab & a^2 \\ ab & b^2 & ab \\ a^2 & ab & a^2 \end{bmatrix} = \begin{bmatrix} x & y & x \\ y & z & y \\ x & y & x \end{bmatrix}$$

where $x=a^2$, $y=ab$, $z=b^2$.

Hence, the above 3×3 separable symmetric digital filter has 3 distinct filter coefficients x, y and z. If there is a two dimensional signal (S) of size M×N, the filtering operation can be represented as follows:

$$Y = S \otimes F_{3\times3},$$

where Y is the output signal after filtering input signal S by above 3×3 separable symmetric digital filter.

$$Y = \begin{bmatrix} y_{0,0} & y_{0,1} & \cdot & \cdots & \cdot & \cdot & y_{0,N-1} \\ y_{1,0} & \cdot & \cdot & \cdot & \cdot & \cdot \\ \vdots & \cdot & \cdot & y_{i,j} & \cdot & \cdot & \vdots \\ \cdot & \cdot & \cdot & \cdot & \cdot & \cdot \\ \cdot & \cdot & \cdot & \cdot & \cdot & \cdot \\ y_{M-1,0} & y_{M-1,1} & \cdot & \cdots & \cdot & \cdot & y_{M-1,N-1} \end{bmatrix},$$

$$S = \begin{bmatrix} s_{0,0} & s_{0,1} & \cdot & \cdots & \cdot & \cdot & s_{0,N-1} \\ s_{1,0} & \cdot & \cdot & & & \cdot & s_{1,N-1} \\ \cdot & \cdot & s_{i-1,j-1} & s_{i-1,j} & s_{i-1,j+1} & \cdot & \cdot \\ \vdots & \cdot & s_{i,j-1} & s_{i,j} & s_{i,j+1} & \cdot & \vdots \\ \cdot & \cdot & s_{i+1,j-1} & s_{i+1,j} & s_{i+1,j+1} & \cdot & \cdot \\ \cdot & \cdot & \cdot & \cdot & \cdot & \cdot \\ s_{M-1,0} & s_{M-1,1} & \cdot & \cdots & \cdot & \cdot & s_{M-1,N-1} \end{bmatrix}$$

An output signal sample $Y_{i,j}$ can be represented as follows:

$$y_{i,j} = s_{i-1,j-1}*x + s_{i-1,j}*y + s_{i-1,j+1}*x + s_{i,j-1}*y + s_{i,j}*z + s_{i,j+1}*y + s_{i+1,j-1}*x + s_{i+1,j}*y + s_{i+1,j+1}*x$$

or $$y_{i,j} = (s_{i-1,j-1} + s_{i-1,j+1} + s_{i+1,j-1} + s_{i+1,j+1})*x + (s_{i-1,j} + s_{i,j-1} + s_{i,j+1} + s_{i+1,j})*y + s_{i,j}*z$$

From the above expression, it is clear that parallel processing can be exploited to achieve fast computation if there are sufficient number of hardware resources. The hardware resources typically take the form of adders and multipliers that can be shared for execution at different clock cycles.

Figure 1:
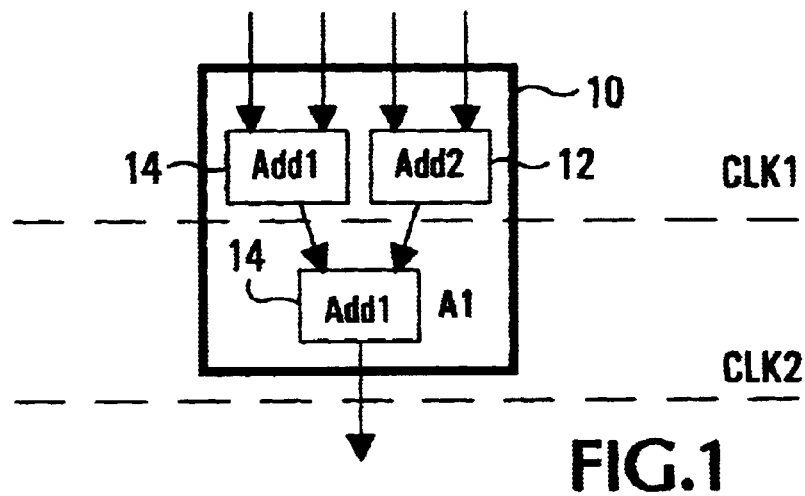
FIG. 1 shows a block diagram of one embodiment of a 4-input adder, in accordance with the invention.

It is possible to implement a 4-input adder using two 2-input adders as shown in FIG. 1. The 4-input adder 10 is made up of two 2-input adders 12 and 14, one of which will be used twice. The format of FIG. 1 is on the order of a timing diagram. Add1 14 receives 2 inputs and adds them. Add2 12 receives another two inputs and adds them. Both of these steps occur during a first clock cycle CLK1. The resulting sums from Add1 and Add2 are fed back into Add1 14 and the result is a sum of 4 inputs achieved in two clock cycles.

Figure 2:
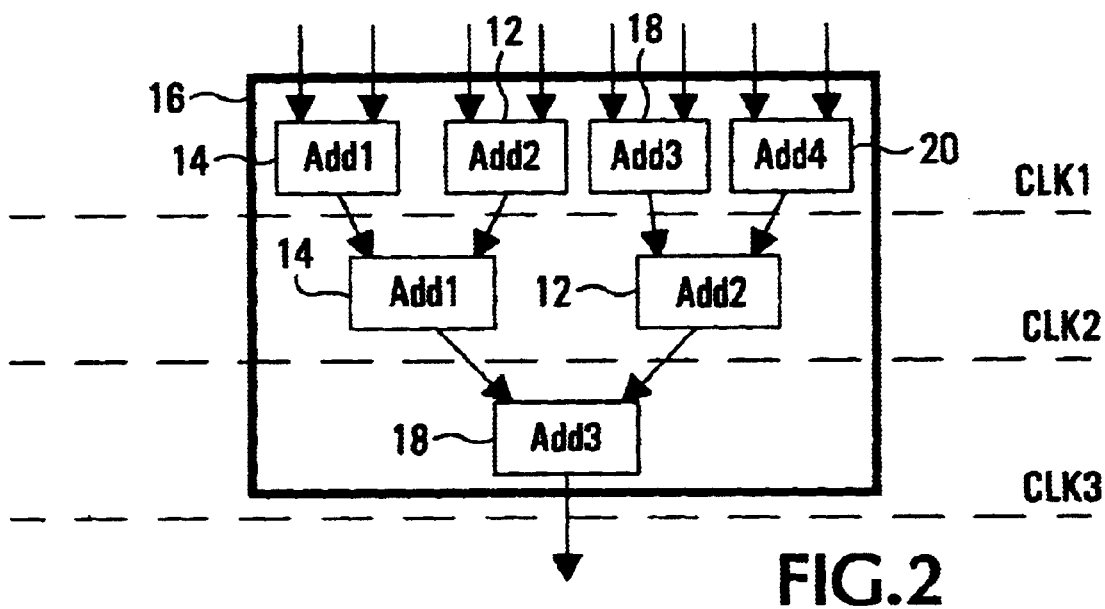
FIG. 2 shows a block diagram of one embodiment of 8-input adder, in accordance with the invention.

This type of architecture can be easily extended to 8-input adders comprised of four 2-input adders as shown in FIG. 2. An 8-input adder 16 is comprised of four 2-input adders Add1 14, Add2 12, Add3 18, and Add4 20. Each adder receives an initial two inputs during a first clock cycle CLK1. The sums created by Add1 14 and Add2 12 are fed back into Add1 14 during a second clock cycle CLK2. At the same time, Add3 18 and Add4 20 receive 2 inputs each and create sums during CLK1. During CLK2, these sums are fed into Add2 12 during the second CLK2. The resulting sum from this add operation is fed into Add3 18, which creates the final sum during CLK3. These are only examples and no limitation of application of the invention to any variation from these specific examples is intended.

Figure 3:
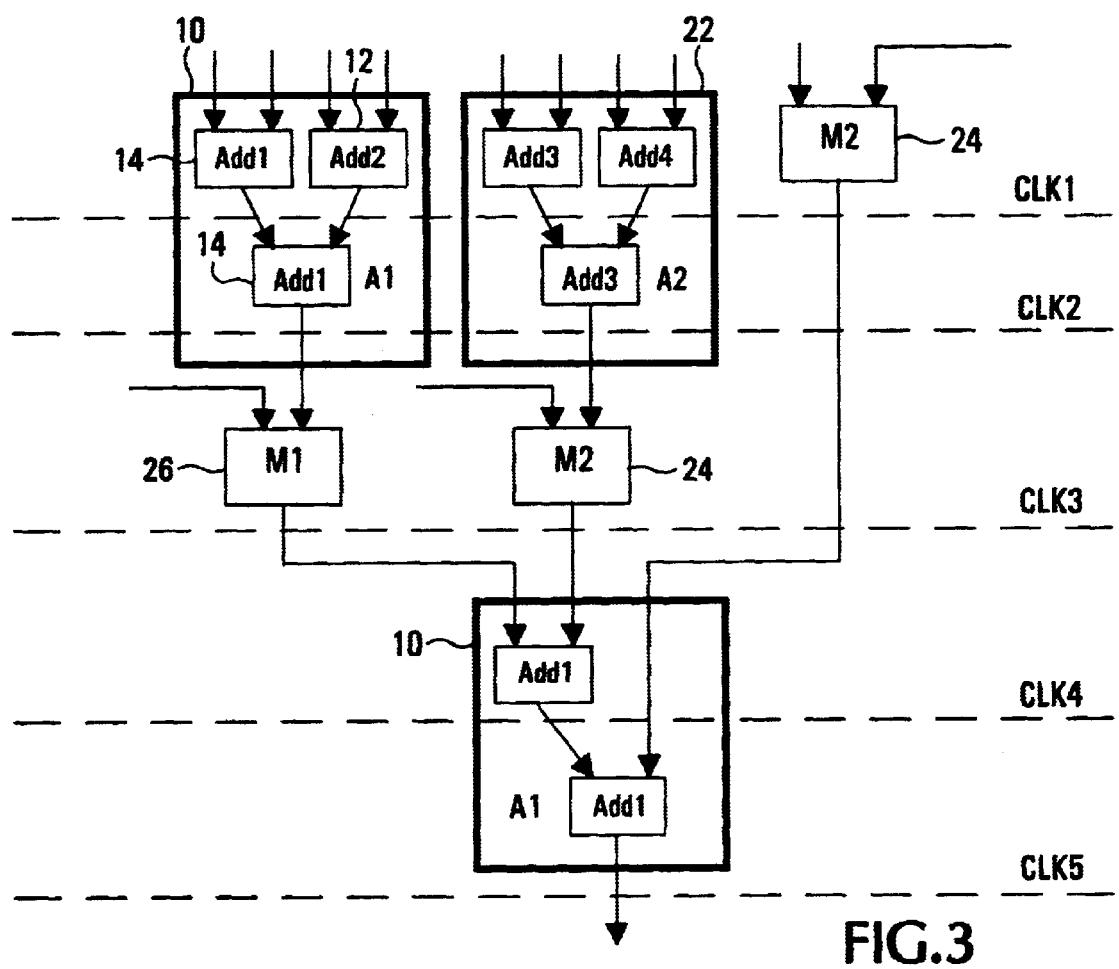
FIG. 3 shows a block diagram of one embodiment of a 3×3 symmetrical filter, in accordance with the invention.

These basic structures can be exploited in parallel operation to result in an optimal hardware filter for digital filter that use a minimal number of clock cycles. An example of such a filter is shown in FIG. 3. The filter is comprised of two 4-input adders and 2 multipliers. In this particular example, each 4-input adder is comprised of two 2-input adders, but no limitation is intended by this specific example.

During a first clock cycle CLK1, each 4-input adders can add four input samples in 2 clock cycles, assuming at least two adders. The input signals $s_{i-1,j-1}$, $s_{i-1,j+1}$, $s_{i+1,j-1}$, $s_{i+1,j+1}$ are allocated to A1. If A1 is designed using two 2-input adders A1 10 and A2 22, it can compute intermediate results $P = s_{i-1,j-1} + s_{i-1,j+1}$ and $Q = s_{i+1,j-1} + s_{i+1,j+1}$ in parallel in first clock cycle CLK1 and the sum $P = Q = s_{i-1,j-1} + s_{i-1,j+1} + s_{i+1,j-1} + s_{i+1,j+1}$ in the second clock cycle CLK2. Similarly, A2 22 computes $s_{i-1,j} + s_{i,j-1} + s_{i,j+1} + s_{i+1,j}$ in parallel with A1. During CLK1, the multiplier M1 can be allocated to compute $s_{i,j}*z$ by allocating the signal $s_{i,j}$ and filter coefficient 'z'.

In the third clock cycle CLK3, the output $s_{i-1,j-1} + s_{i-1,j+1} + s_{i+1,j-1} + s_{i+1,j+1}$ is allocated from adder A1 10 and filter coefficient 'x' to the multiplier M1, as well as the output $s_{i-1,j} + s_{i,j-1} + s_{i,j+1} + s_{i+1,j}$ from adder A2 22 and filter coefficient 'y' to the multiplier M2 in parallel.

The results $(s_{i-1,j-1} + s_{i-1,j+1} + s_{i+1,j-1} + s_{i+1,j+1})*x$, $(s_{i-1,j} + s_{i,j-1} + s_{i,j+1} + s_{i+1,j})*y$ and $s_{i,j}*z$ are allocated to the adder A1 to produce the final result in subsequent two clock cycles CLK4 and CLK5 respectively as shown in FIG. 3. In this manner, a 3×3 separable symmetric filtering operation is accomplished in five clock cycles using two 4-input adders 10 and 22 and two multipliers 24 and 26. As mentioned above, the 4-input adders are shown as being comprises of two 2-input adders each, but other configurations are possible and within the scope of the invention.

Having seen one example of a specific implementation of an optimal hardware filter implemented in accordance with the invention, the specifics can be applied in general terms. It is helpful to first characterize the incoming signal S samples in order to allocate them to the appropriate computation modules of adders and multipliers.

Below are the samples of an incoming signal.

$$S = \begin{bmatrix} \vdots & \vdots & \vdots & \vdots & \vdots & \vdots & \vdots \\ \cdots s_{i-3,j-3} & \cdots s_{i-3,j-2} & \cdots s_{i-3,j-1} & \cdots s_{i-3,j} & \cdots s_{i-3,j+1} & \cdots s_{i-3,j+2} & \cdots s_{i-3,j+3} \\ \cdots s_{i-2,j-3} & \cdots s_{i-2,j-2} & \cdots s_{i-2,j-1} & \cdots s_{i-2,j} & \cdots s_{i-2,j+1} & \cdots s_{i-2,j+2} & \cdots s_{i-2,j+3} \\ \cdots s_{i-1,j-3} & \cdots s_{i-1,j-2} & \cdots s_{i-1,j-1} & \cdots s_{i-1,j} & \cdots s_{i-1,j+1} & \cdots s_{i-1,j+2} & \cdots s_{i-1,j+3} \\ \cdots s_{i,j-3} & \cdots s_{i,j-2} & \cdots s_{i,j-1} & \cdots s_{i,j} & \cdots s_{i,j+1} & \cdots s_{i,j+2} & \cdots s_{i,j+3} \\ \cdots s_{i+1,j-3} & \cdots s_{i+1,j-2} & \cdots s_{i+1,j-1} & \cdots s_{i+1,j} & \cdots s_{i+1,j+1} & \cdots s_{i+1,j+2} & \cdots s_{i+1,j+3} \\ \cdots s_{i+2,j-3} & \cdots s_{i+2,j-2} & \cdots s_{i+2,j-1} & \cdots s_{i+2,j} & \cdots s_{i+2,j+1} & \cdots s_{i+2,j+2} & \cdots s_{i+2,j+3} \\ \cdots s_{i+3,j-3} & \cdots s_{i+3,j-2} & \cdots s_{i+3,j-1} & \cdots s_{i+3,j} & \cdots s_{i+3,j+1} & \cdots s_{i+3,j+2} & \cdots s_{i+3,j+3} \\ \vdots & \vdots & \vdots & \vdots & \vdots & \vdots & \vdots \end{bmatrix}$$

Looking at the 2-D filter carefully, it can be decomposed into N−1/2 squares and the central coefficient as shown below with example of $F_{7\times7}$ which will have 3 squares and the center element (q).

$$F_{7\times7} = \begin{bmatrix} . & . & . & . & . & . & . \\ . & . & . & . & . & . & . \\ . & . & s & r & s & . & . \\ . & . & r & . & r & . & . \\ . & . & s & r & s & . & . \\ . & . & . & . & . & . & . \\ . & . & . & . & . & . & . \end{bmatrix} + \begin{bmatrix} . & . & . & . & . & . & . \\ . & v & u & t & u & v & . \\ . & u & . & . & . & u & . \\ . & t & . & . & . & t & . \\ . & u & . & . & . & u & . \\ . & v & u & t & u & v & . \\ . & . & . & . & . & . & . \end{bmatrix} + \begin{bmatrix} x & y & z & w & z & y & x \\ y & . & . & . & . & . & y \\ z & . & . & . & . & . & z \\ w & . & . & . & . & . & w \\ z & . & . & . & . & . & z \\ y & . & . & . & . & . & y \\ x & y & z & w & z & y & x \end{bmatrix} + \begin{bmatrix} . & . & . & . & . & . & . \\ . & . & . & . & . & . & . \\ . & . & . & . & . & . & . \\ . & . & . & q & . & . & . \\ . & . & . & . & . & . & . \\ . & . & . & . & . & . & . \\ . & . & . & . & . & . & . \end{bmatrix}$$

Reviewing the squares above, it is possible to decompose the array into several different components.

The four corner elements in each square are always identical and hence the corresponding four samples in signal S can be added and multiplied with that coefficient. These samples will be referred to as "SCE" to represent Square Corner Elements. For example, $\{s_{i-3,j-3}, s_{i-3,j+3}, s_{i+3,j-3}, s_{i+3,j+3}\}$ are the SCEs corresponding to the third square in $F_{7\times7}$ and hence these samples can be added together and multiplied by the corresponding filter coefficient x in the third square to produce $(s_{i-3,j-3}+s_{i-3,j+3}+s_{i+3,j-3}+s_{i+3,j+3})*x$. Similarly, $(s_{i-2,j-2}+s_{i-2,j+2}+s_{i+2,j-2}+s_{i+2,j+2})*v$ and $(s_{i-1,j-1}+s_{i-1,j+1}+s_{i+1,j-1}+s_{i+1,j+1})*s$ corresponds to the second and first squares in $F_{7\times7}$.

Similarly, the four middle elements in all the four edges in a square are the same. These will be referred to as corresponding samples of signal S as "SME" to represent Square Middle Elements. For example, $\{s_{i-3,j}, s_{i,j-3}, s_{i+3,j}, s_{i,j+3}\}$ are the SMEs corresponding to the third square in $F_{7\times7}$ and hence these samples can be added together and multiplied by the corresponding filter coefficient w in the third square to produce $(s_{i-3,j}+s_{i,j-3}+s_{i+3,j}+s_{i,j+3})*w$. Similarly, $(s_{i-2,j}+s_{i,j-2}+s_{i+2,j}+s_{i,j+2})*t$ and $(s_{i-1,j}+s_{i,j-1}+s_{i+1,j}+s_{i,j+1})*r$ corresponds to the second and first squares in $F_{7\times7}$.

There are one SCE and one SME for each square. Therefore, there are N−1/2 SCE's and N−1/2 SME's for an N×N filter. Each SCE or SME needs a 4-input adder. Hence, the filter needs a total N−1 number of 4-input adders and N×1 multipliers to implement SCE's and SME's.

In the 7×7 example above, there are eight identical elements in the filter, which are all unit distant from the nearest corner element. For example, all the elements y are away by unit distance from the corner element x in the first square. These could be referred to as "D1CE" to represent Distance One from Corner Elements. Input samples $\{s_{i-3,j-2}, s_{i-2,j-3}, s_{i+2,j-3}, s_{i+3,j-2}, s_{i+3,j+2}, s_{i+2,j+3}, s_{i-2,j+3}, s_{i-3,j+2}\}$ are the DICEs corresponding to the third square in $F_{7\times7}$ and hence these samples can be added together and multiplied by the corresponding filter coefficient y in the third square to produce $(s_{i-3,j-2}+s_{i-2,j-3}+s_{i+2,j-3}+s_{i+3,j-2}+s_{i+3,j+2}+s_{i+2,j+3}+s_{i-2,j+3}+s_{i-3,j+2})*y$. Similarly, $(s_{i-2,j-1}+s_{i-1,j-2}+s_{i+1,j-2}+s_{i+2,j-1}+s_{i+2,j+1}+s_{i+1,j+2}+s_{i-2,j+1}+s_{i-1,j+2})*u$ corresponds to the second square in $F_{7\times7}$. This one does not exist in the first square. Hence, there are a total of 2 D1CE's in 7×7 filtering.

However, the definition of D1CEs can be expanded to any element that is a unit distance from the square corner elements (SCEs). In general, a "DkCE' may be defined to represent Distance k from Corner Elements, referred to as distance corner elements. For example, $\{s_{i-3,j-1}, s_{i-1,j-3}, s_{i+1,j-3}, s_{i+3,j-1}, s_{i+3,j+1}, s_{i+1,j+3}, s_{i-1,j+3}, s_{i-3,j+1}\}$ are the D2CEs corresponding to the third square in $F_{7\times7}$ and hence these samples can be added together and multiplied by the corresponding filter coefficient z in the third square to produce $s_{i-3,j-1}+s_{i-1,j-3}+s_{i+1,j-3}+s_{i+3,j-1}+s_{i+3,j+1}+s_{i+1,j+3}+s_{i-1,j+3}+s_{i-3,j+1})*z$. This one does not exist in second and third squares. Hence, there are 1 D2CE in 7×7 filtering.

There are total 1+2=3 DkCEs in 7×7 filtering. After working out in the similar fashion, it can be seen that there will be total 1+2+3=6 DkCE's in a 9×9 filter. In general there will be $$1+2+\ldots+\frac{N-3}{2} = \frac{(N-1)(N-3)}{8}$$

DkDE's in an N×N filter. To implement DkCEs, that many 8-input adders and multipliers are needed.

The following general relationships can be exploited to implement the optimal filter. The number of distinct coefficients ($N_D$) in the 2-D kernel of N×N Separable Symmetric Filter is $$N_D = 1+2+3+\ldots+\frac{N-1}{2} = \frac{(N+1)(N+3)}{8}.$$

The number of 8-input addition ($N_{ADD8}$) computed in parallel is the same as the number of DkCE's and this is $$N_{ADD8} = \frac{(N-1)(N-3)}{8}.$$

This is a predetermined number of 8-input adders. If they are comprised of 2-input adders, as shown in FIG. 2, the number of those can be computed by $$N_{2ADD8} = 4*\frac{(N-1)(N-3)}{8} = \frac{(N-1)(N-3)}{2}$$

fast adders.

The number of 4-input adders ($N_{ADD4}$) computed in parallel is $N_{ADD4}=N-1$. This is implemented by $N_{2ADD4}=2(N-1)$ fast adders, if each 4-input adders is further comprised of two 2-input adders. From this the total number of 2-input adders required is $$N_{ADD2} = N_{2ADD8} + N_{2ADD4} = \frac{N^2-1}{2}.$$

The number of parallel multipliers ($N_M$)required is $N_M=\max\{N_{ADD8}, N_{ADD4}\}$.

A method of implementing a symmetric digital filter in accordance with the invention can be seen by any of the diagrams in FIGS. 3–9. If the necessary computing resources meet the requirements above, a symmetric digital filter can be implemented as follows.

Allocate input signals of each of $$\frac{N-1}{2}$$

SCE's to a 4-input adder. Allocate input signals of each of $$\frac{N-1}{2}$$

SME's to a 4-input adders. Allocate input signals of each of $$\frac{(N-1)(N-3)}{8}$$

DkCE's to an 8-input adder.

Each of the 4-input adders can add four input numbers in 2 clock cycles CLK1 and CLK2. An example of four input adder module A1 was shown in FIG. 1. Each of the 8-input adders can add 8 input number in 3 clock cycles CLK1, CLK2 and CLK3. An 8-input adder is exemplified in FIG. 2.

During CLK 1, allocate the signal $s_{i,j}$ and the center filter coefficient (e.g. q in $F_{7\times 7}$) to the multiplier M1 to compute $s_{i,j}*q$. In the third clock cycle (CLK3), allocate the outputs from N−1 number of 4-input adders and the corresponding filtering coefficients to N−1 multipliers. During fourth clock CLK4, use $$\frac{N-1}{2}$$

number of 2-input adders to add pairs of results output from all the 4-input adders. These $$\frac{N-1}{2}$$

adders produce $$\frac{N-1}{2}$$

partial sums.

During CLK4, allocate the results of output from $$\frac{(N-1)(N-3)}{8}$$

8-input adders and the corresponding filter coefficients to $$\frac{(N-1)(N-3)}{8}$$

multipliers. At the end of CLK4, there will be total $$\frac{N_{ADD4}}{2}+1+N_{ADD8}=\frac{N^2+7}{8}$$

partial results to be added which will require $\log_2$ $$\left\lceil \frac{N^2+7}{8} \right\rceil$$

clock cycles. During next $\log_2$ $$\left\lceil \frac{N^2+7}{8} \right\rceil$$

clock cycles (CLK5, CLK6 . . . ), add $$\left\lceil \frac{N^2+7}{8} \right\rceil$$

partial results to produce the filtered output.

This general approach can be applied to any specific symmetric filter design, provided that the filter is set up with N rows and N columns and N is an odd number. The two-dimensional kernel for 5×5 separable symmetric filtering can be derived as $$F_{5\times 5}=\begin{bmatrix}a\\b\\c\\b\\a\end{bmatrix}*[a\ b\ c\ b\ a]=\begin{bmatrix}a^2 & ab & ac & ab & a^2\\ab & b^2 & bc & b^2 & ab\\ac & bc & c^2 & bc & ac\\ab & b^2 & bc & b^2 & ab\\a^2 & ab & ac & ab & a^2\end{bmatrix}=\begin{bmatrix}x & y & z & y & x\\y & u & v & u & y\\z & v & w & v & z\\y & u & v & u & y\\x & y & z & y & x\end{bmatrix}$$

where $x=a^2, y=ab, z=ac, u=b^2, v=bc, w=c^2$.

The above 5×5 separable symmetric digital filter has 6 distinct filter coefficients x, y, z, u, v and w. With a two-dimensional signal (S) of size M×N, the filtering operation can be represented as follows:

$$Y=\begin{bmatrix}\vdots & \vdots & \vdots & \vdots & \vdots & \vdots & \vdots\\ \cdots & S_{i-2,j-2'} & S_{i-2,j-1} & S_{i-2,j} & S_{i-2,j+1} & S_{i-2,j+2} & \cdots\\ \cdots & S_{i-1,j-2} & S_{i-1,j-1} & S_{i-1,j} & S_{i-1,j+1} & S_{i-1,j+2} & \cdots\\ \cdots & S_{i,j-2} & S_{i,j-1} & S_{i,j} & S_{i,j+1} & S_{i,j+2} & \cdots\\ \cdots & S_{i+1,j-2} & S_{i+1,j-1} & S_{i+1,j} & S_{i+1,j+1} & S_{i+1,j+2} & \cdots\\ \cdots & S_{i+2,j-2} & S_{i+2,j-1} & S_{i+2,j} & S_{i+2,j+1} & S_{i+2,j+2} & \cdots\\ \vdots & \vdots & \vdots & \vdots & \vdots & \vdots & \vdots\end{bmatrix}\otimes\begin{bmatrix}x & y & z & y & x\\y & u & v & u & y\\z & v & w & v & z\\y & u & v & u & y\\x & y & z & y & x\end{bmatrix}$$

where an output sample $y_{i,j}$ can be represented as follows:

$y_{i,j} = s_{i,j}*w + (s_{i-2,j-2} + s_{i-2,j+2}$ $+ s_{i+2,j-2} + s_{i+2,j+}$ $2)*x + (s_{i-1,j-1}$ $+ s_{i-1,j+1} + s_i$ $+1,j-1 s_{i+1,j+1})*u +$ $(s_{i-2,j} + s_{i+2,j}$ $+ s_{i,j-2} + s_{i,j+2})*z +$ $(s_{i-1,j} + s_{i+1,j} +$ $s_{i,j-1} + s_{i,j+1})*v +$ $(s_{i-2,j-1} + s_{i-2,j+1}$ $+ s_{i-1,j-2} + s_{i-1,j+2}$ $+ s_{i+1,j-2} + s_{i+}$ $1,j+2 + s_{i+2,j-1} + s_{i+2,j+1})*y$

From the above expression, it can be concluded that the filter can accomplish optimum speed performance if with four parallel 4-input adders and one 8-input adder, and 4 multipliers.

Figure 4:
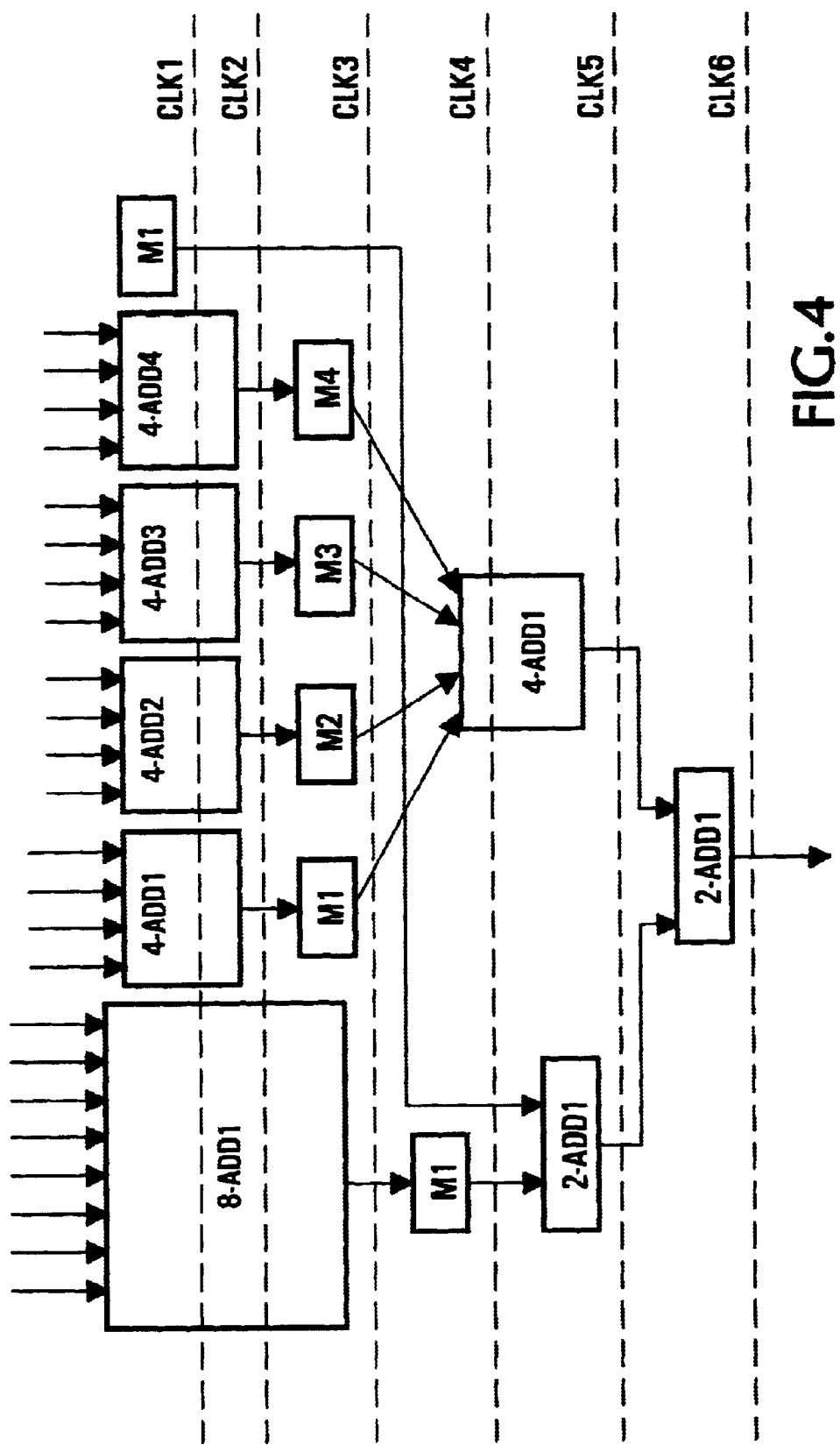
FIG. 4 shows a block diagram of one embodiment of a 5×5 symmetrical filter, in accordance with the invention.

Referring now to FIG. 4, it is possible to discuss one embodiment of method of implementing a 5×5 digital filter. Allocate input signals $s_{i-2,j-2}$, $s_{i-2,j+2}$, $s_{i+2,j-2}$, $s_{i+2,j+2}$ to the 4-input adder 4-ADD1, $s_{i-1,j-1}$, $s_{i-1,j+1}$, $s_{i+1,j-1}$, $s_{i+1,j+1}$ to the 4-input adder 4-ADD2, $s_{i-2,j}$, $s_{i+2,j}$, $s_{i,j-2}$, $s_{i,j+2}$ to the 4-input adder 4-ADD3 and $s_{i-1,j}$, $s_{i+1,j}$, $s_{i,j-1}$, $s_{i,j+1}$ to the 4-input adder 4-ADD4 at the beginning of the first clock CLK1. The 4-input adders 4-ADD1, 4-ADD2 4-ADD3, 4-ADD4 generate outputs SUM1,SUM2,SUM3,SUM4 respectively in parallel in 2 clock cycles at the end of CLOCK 2 as shown in FIG. 3.

The next step is to allocate the input signals $s_{i-2,j-1}$, $s_{i-2,j+1}$, $s_{i-1,j-2}$, $s_{i-1,j+2}$, $s_{i+1,j-2}$, $s_{i+1,j+2}$, $s_{i+2,j-1}$, $s_{i+2,j+1}$ to the 8-input adder 8-ADD1 at the beginning of first clock CLK1 and generate the output SUM5 in 3 clock cycles at the end of CLK3 as shown in FIG. 3. Meanwhile, multiplier M1 computes PROD1=$s_{i,j}*w$ in 1 clock cycle CLOCK 1.

Parallel multiplication by M1, M2 M3 and M4 are computed in 1 clock cycle CLK3. M1 multiplies SUM1 by filter coefficient x to produce PROD2. M2 multiplies SUM2 by filter coefficient u to produce PROD3. M3 multiplies SUM3 by filter coefficient z to produce PROD4. M4 multiplies SUM4 by filter coefficient v to produce PROD5. During CLK4, M1 multiples SUM5 by filter coefficient y to produce PROD6.

The next step allocates PROD2, PROD3, PROD4, PROD5 to the 4-input adder 4-ADD1 at the beginning of CLK4 and generate the output SUM6 in 2 clock cycles at the end of CLK5. During the fifth clock CLK5, 2-ADD1 adds PROD1 and PROD5 to produce SUM7. It should be noted that 2-ADD1 is a 2-input adder which was used to implement 8-ADD1. In CLK6, the same two input adder 2-ADD1 adds SUM6 and SUM7 to produce the final result $y_{i,j}$.

Having viewed the specific details of application of the invention to a 5×5 digital filter, it is now possible to briefly see the implementations for several more filters. For example, a 7×7 filter will have a coefficient array of:

$$F_{7\times7} = \begin{bmatrix} a \\ b \\ c \\ d \\ c \\ b \\ a \end{bmatrix} * [a \ b \ c \ d \ c \ b \ a] = \begin{bmatrix} a^2 & ab & ac & ad & ac & ab & a^2 \\ ab & b^2 & bc & bd & bc & b^2 & ab \\ ac & bc & c^2 & cd & c^2 & bc & ac \\ ad & bd & cd & d^2 & cd & bd & ad \\ ac & bc & c^2 & cd & c^2 & bc & ac \\ ab & b^2 & bc & bd & bc & b^2 & ab \\ a^2 & ab & ac & ad & ac & ab & a^2 \end{bmatrix} = \begin{bmatrix} x & y & z & w & z & y & x \\ y & v & u & t & u & v & y \\ z & u & s & r & s & u & z \\ w & t & r & q & r & t & w \\ z & u & s & r & s & u & z \\ y & v & u & t & u & v & y \\ x & y & z & w & z & y & x \end{bmatrix}$$

where $x=a^2, y=ab, z=ac, u=bc, v=b^2, w=ad, t=bd, s=c^2, r=cd, q=d^2$.

Hence, the above 7×7 separable symmetric digital filter has 10 distinct filter coefficients x, y, z, u, v, w, s, r, t and q.

Figure 5:
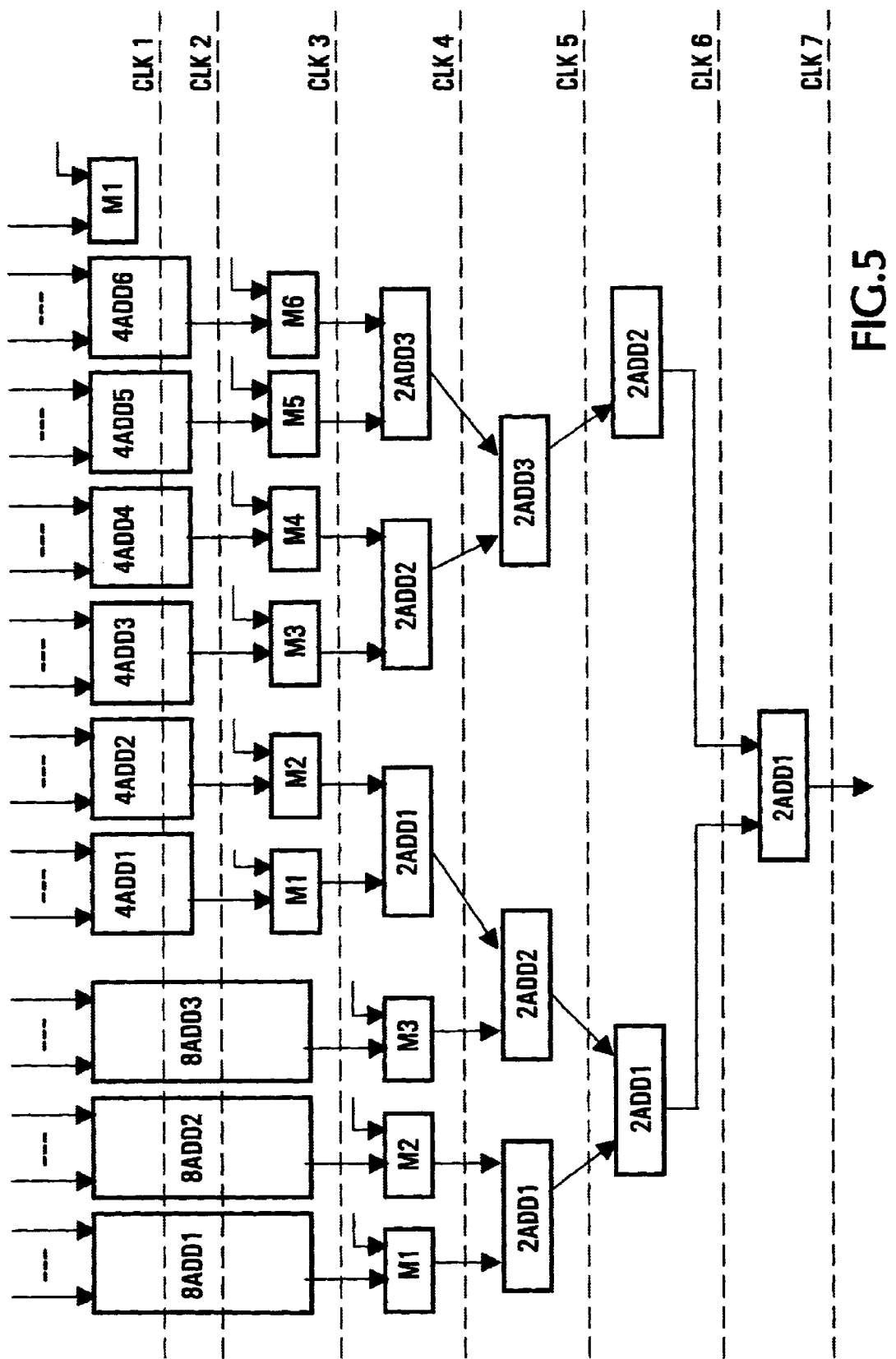
FIG. 5 shows a block diagram of one embodiment of a 7×7 symmetrical filter, in accordance with the invention.

Based on similar analysis done in the previous two examples (3×3 and 5×5), it can be concluded that the optimal architecture will require three 8-input adders, six 4-input adders, and six multipliers. The 7×7 filtering can be done accomplished in seven clocks per sample and that is the theoretical minimum one can achieve. An example of such a filter is shown in FIG. 5.

A kernel for 9×9 separable symmetric filter $F_{9\times9}$ has 15 distinct filter coefficients a, b, c, d, e, x, y, z, w, v, u, t, s, r and q. Arrangement of these filtering coefficients in the 9×9 kernel $F_{9\times9}$ is shown below.

$$F_{9\times9} = \begin{bmatrix} a & b & c & d & e & d & c & b & a \\ b & x & y & z & w & z & y & x & b \\ c & y & v & u & t & u & v & y & c \\ d & z & u & s & r & s & u & z & d \\ e & w & t & r & q & r & t & w & e \\ d & z & u & s & r & s & u & z & d \\ c & y & v & u & t & u & v & y & c \\ b & x & y & z & e & z & y & x & b \\ a & b & c & d & e & d & c & b & a \end{bmatrix}$$

$y_{i,j} = s_{i,j}*q + (s_{i-4,j-4}$ $+ s_{i-4,j+4} + s_{i+4,j-4} + s_{i+4,j+}$ $4)*a + (s_{i-3,j-3} + s_{i-3,j+3}$ $+ s_{i+3,j-3} + s_{i+3,j+3})*x +$ $(s_{i-2,j-2} + s_{i-2,j+2}$ $+ s_{i+2,j-2} + s_{i+2,j+2})*v +$ $(s_{i-1,j-1} +$ $s_{i-1,j+1} + s_{i+1,j-1}$ $+s_{i+1,j+1})*s+$ $(s_{i-4,j}+s_{i+4,j}+s_{i,j-4}$ $+s_{i,j+4})*e+(s_{i-3,j}+s_{i+3,j}+$ $s_{i,j-3}+s_{i,j+3})*w+$ $(s_{i-2,j}+s_{i+2,j}$ $+s_{i,j-2}+s_{i,j+2})*t+$ $(s_{i-1,j}+s_{i+1,j}$ $+s_{i,j-1}+s_{i,j+1})*r+$ $(s_{i-4,j-3}+s_{i-4,j+3}$ $+s_{i-3,j-4}+s_{i-3,j+4}$ $+s_{i+3,j-4}+$ $s_{i+3,j+4}+s_{i+4,j-3}$ $+s_{i+4,j+3})*b+$ $(s_{i-3,j-2}+s_{i-3,j+2}$ $+s_{i-2,j-3}+s_{i-2,j+3}$ $+s_{i+2,j-3}+$ $s_{i+2,j+3}+s_{i+3,j-2}$ $+s_{i+3,j+2})*y+$ $(s_{i-2,j-1}+s_{i-2,j+1}$ $+s_{i-1,j-2}+s_{i-1,j+2}$ $+s_{i+1,j-2}+$ $s_{i+1,j+2}+s_{i+2,j-1}$ $+s_{i+2,j+1})*u+$ $(s_{i-4,j-2}+s_{i-4,j+2}$ $+s_{i-2,j-4}+s_{i-2,j+4}$ $+s_{i+2,j-4}+$ $s_{i+2,j+4}+s_{i+4,j-2}$ $+s_{i+4,j+2})*c+$ $(s_{i-3,j-1}+s_{i-3,j+1}$ $+s_{i-1,j-3}+s_{i-1,j+3}$ $+s_{i+1,j-3}+$ $s_{i+1,j+3}+s_{i+3,j-1}$ $+s_{i+3,j+1})*z+$ $(s_{i-4,j-1}+s_{i-4,j+1}$ $+s_{i-1,j-4}+s_{i-1,j+4}$ $+s_{i+1,j-4}+$ $s_{i+1,j+4}+s_{i+4,j-1}$ $+s_{i+4,j+1})*d+$

Figure 6:
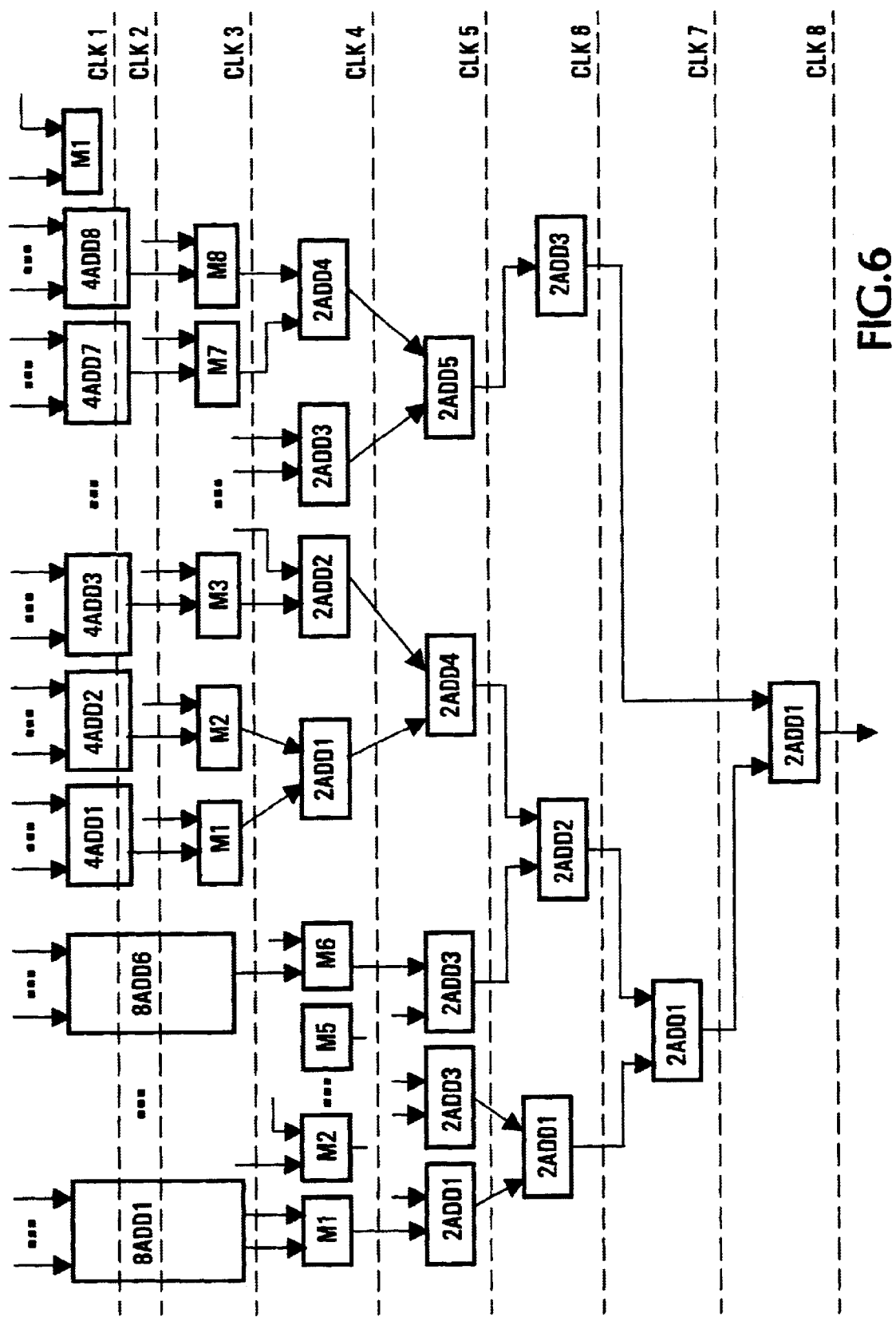
FIG. 6 shows a block diagram of one embodiment of a 9×9 symmetrical filter, in accordance with the invention.

From the above expression for $y_{i,j}$, it can be deduced that optimal speed performance can be achieved by exploiting the underlying data parallelism with eight parallel 4-input adders, and six 8-input adders, and six multipliers. An example of this is shown in FIG. 6.

For an 11×11 filter, the kernel is:

A kernel for 11×11 separable symmetric filter $F_{11\times11}$ has 21 distinct filter coefficients f, g, h, i, j, k, a, b, c, d, e, x, y, z, w, v, u, t, s, r and q. Arrangement of these filtering coefficients in the 11×11 kernel $F_{11\times11}$ is shown below.

$$F_{11\times11} = \begin{bmatrix} f & g & h & i & j & k & j & i & h & g & f \\ g & a & b & c & d & e & d & c & b & a & g \\ h & b & x & y & z & w & z & y & x & b & h \\ i & c & y & v & u & t & u & v & y & c & i \\ j & d & z & u & s & r & s & u & z & d & j \\ k & e & w & t & r & q & r & t & w & e & k \\ j & d & z & u & s & r & s & u & z & d & j \\ i & c & y & v & u & t & u & v & y & c & i \\ h & b & x & y & z & w & z & y & x & b & h \\ g & a & b & c & d & e & d & c & b & a & g \\ f & g & h & i & j & k & j & i & h & g & f \end{bmatrix}$$

Figure 7:
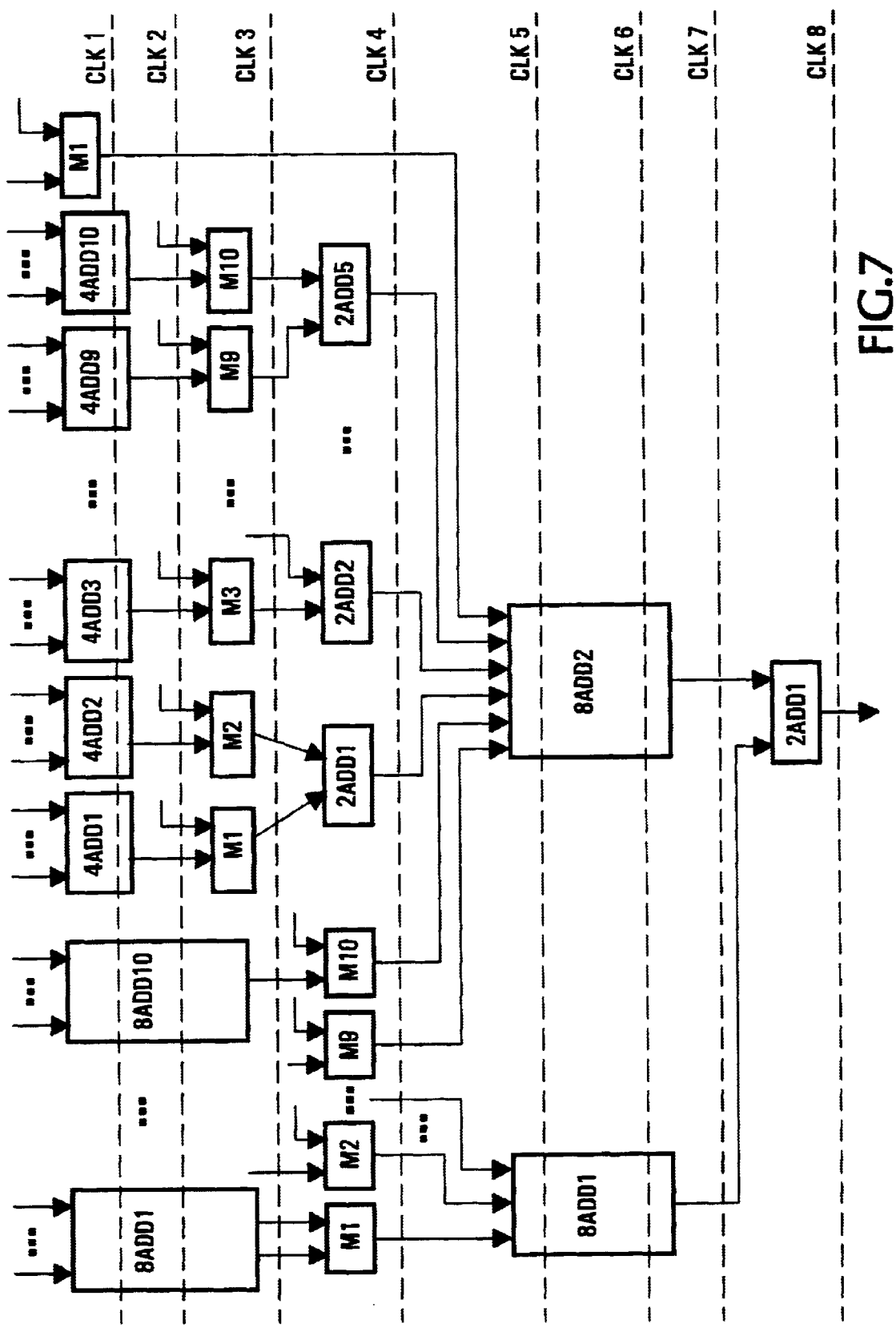
FIG. 7 shows a block diagram of one embodiment of an 11×11 symmetrical filter, in accordance with the invention.

Applying the same process as was used in the previous examples it can be deduced that optimum speed performance could be achieved by exploiting the underlying data parallelism with 10 4-input adders and 10 8-input adders. Exploiting parallelism it is possible to implement the filter with ten parallel multipliers. An example is shown in FIG. 7.

It has previously been described one can accomplish 4-input addition using two 2-input adders only in 2 clock cycles and 8-input addition using four 2-input adders only in 3 clock cycles in the accompanying disclosure. Adopting these techniques, total number of 2-input adders required to accomplish optimal performance is 60. The specific numbers for each filter example is found by the formula $N_{ADD2}$, given above.

The kernel for a 13×13 filter is:

A kernel for 13×13 separable symmetric filter $F_{13\times13}$ has 28 distinct filter coefficients ψ, β, γ, δ, μ, π, ξ, f, g, h, i, j, k, a, b, c, d, e, x, y, z, w, v, u, t, s, r and q. Arrangement of these filtering coefficients in the 13×13 kernel $F_{13\times13}$ is shown below. Details for deriving such a two-dimensional filter kernel has been described in the accompanying disclosure "*Hardware algorithm for optimal performance of 2-Dimensional Separable Symmetric Filtering*".

$$F_{13\times13} = \begin{bmatrix} \psi & \beta & \gamma & \delta & \mu & \pi & \zeta & \pi & \mu & \delta & \gamma & \beta & \psi \\ \beta & f & g & h & i & j & k & j & i & h & g & f & \beta \\ \gamma & g & a & b & c & d & e & d & c & b & a & g & \gamma \\ \delta & h & b & x & y & z & w & z & y & x & b & h & \delta \\ \mu & i & c & y & v & u & t & u & v & y & c & i & \mu \\ \pi & j & d & z & u & s & r & s & u & z & d & j & \pi \\ \zeta & k & e & w & t & r & q & r & t & w & e & k & \zeta \\ \pi & j & d & z & u & s & r & s & u & z & d & j & \pi \\ \mu & i & c & y & v & u & t & u & v & y & c & i & \mu \\ \delta & h & b & x & y & z & w & z & y & x & b & h & \delta \\ \gamma & g & a & b & c & d & e & d & c & b & a & g & \gamma \\ \beta & f & g & h & i & j & k & j & i & h & g & f & \beta \\ \psi & \beta & \gamma & \delta & \mu & \pi & \zeta & \pi & \mu & \delta & \gamma & \beta & \psi \end{bmatrix}$$

Figure 8:
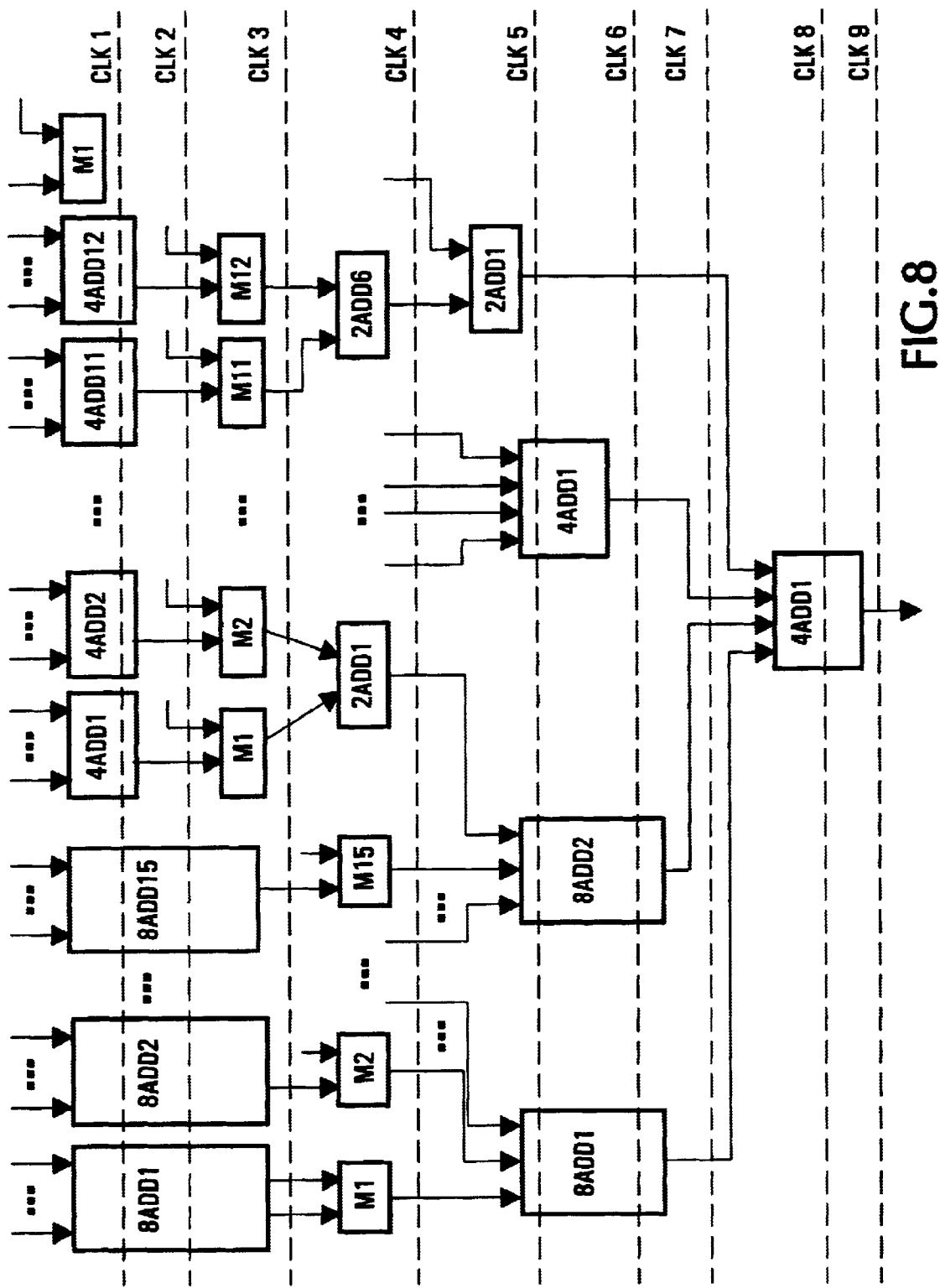
FIG. 8 shows a block diagram of one embodiment of a 13×13 symmetrical filter, in accordance with the invention.

From the expression for $y_{i,j}$, it can be deduced that optimum speed performance can be achieved by exploiting the underlying data parallelism with twelve parallel 4-input adders, fifteen parallel 8-input adders, and fifteen multipliers. An example of one embodiment of such as filter is shown in FIG. 8.

The kernel for a 15×15 digital filter is:

$$F_{15 \times 15} = \begin{bmatrix} \vartheta & \phi & \varphi & \eta & \lambda & \theta & \sigma & \xi & \sigma & \theta & \lambda & \eta & \varphi & \phi & \varphi \\ \phi & \psi & \beta & \gamma & \delta & \mu & \pi & \zeta & \pi & \mu & \delta & \gamma & \beta & \psi & \phi \\ \varphi & \beta & f & g & h & i & j & k & j & i & h & g & f & \beta & \varphi \\ \eta & \gamma & g & a & b & c & d & e & d & c & b & a & g & \gamma & \eta \\ \lambda & \delta & h & b & x & y & z & w & z & y & x & b & h & \delta & \lambda \\ \theta & \mu & i & c & y & v & u & t & u & v & y & c & i & \mu & \theta \\ \sigma & \pi & j & d & z & u & s & r & s & u & z & d & j & \pi & \sigma \\ \xi & \zeta & k & e & w & t & r & q & r & t & w & e & k & \zeta & \xi \\ \sigma & \pi & j & d & z & u & s & r & s & u & z & d & j & \pi & \sigma \\ \theta & \mu & i & c & y & v & u & t & u & v & y & c & i & \mu & \theta \\ \lambda & \delta & h & b & x & y & z & w & z & y & x & b & h & \delta & \lambda \\ \eta & \gamma & g & a & b & c & d & e & d & c & b & a & g & \gamma & \eta \\ \varphi & \beta & f & g & h & i & j & k & j & i & h & g & f & \beta & \varphi \\ \phi & \psi & \beta & \gamma & \delta & \mu & \pi & \zeta & \pi & \mu & \delta & \gamma & \beta & \psi & \phi \\ \vartheta & \phi & \varphi & \eta & \lambda & \theta & \sigma & \xi & \sigma & \theta & \lambda & \eta & \varphi & \phi & \vartheta \end{bmatrix}$$

Figure 9:
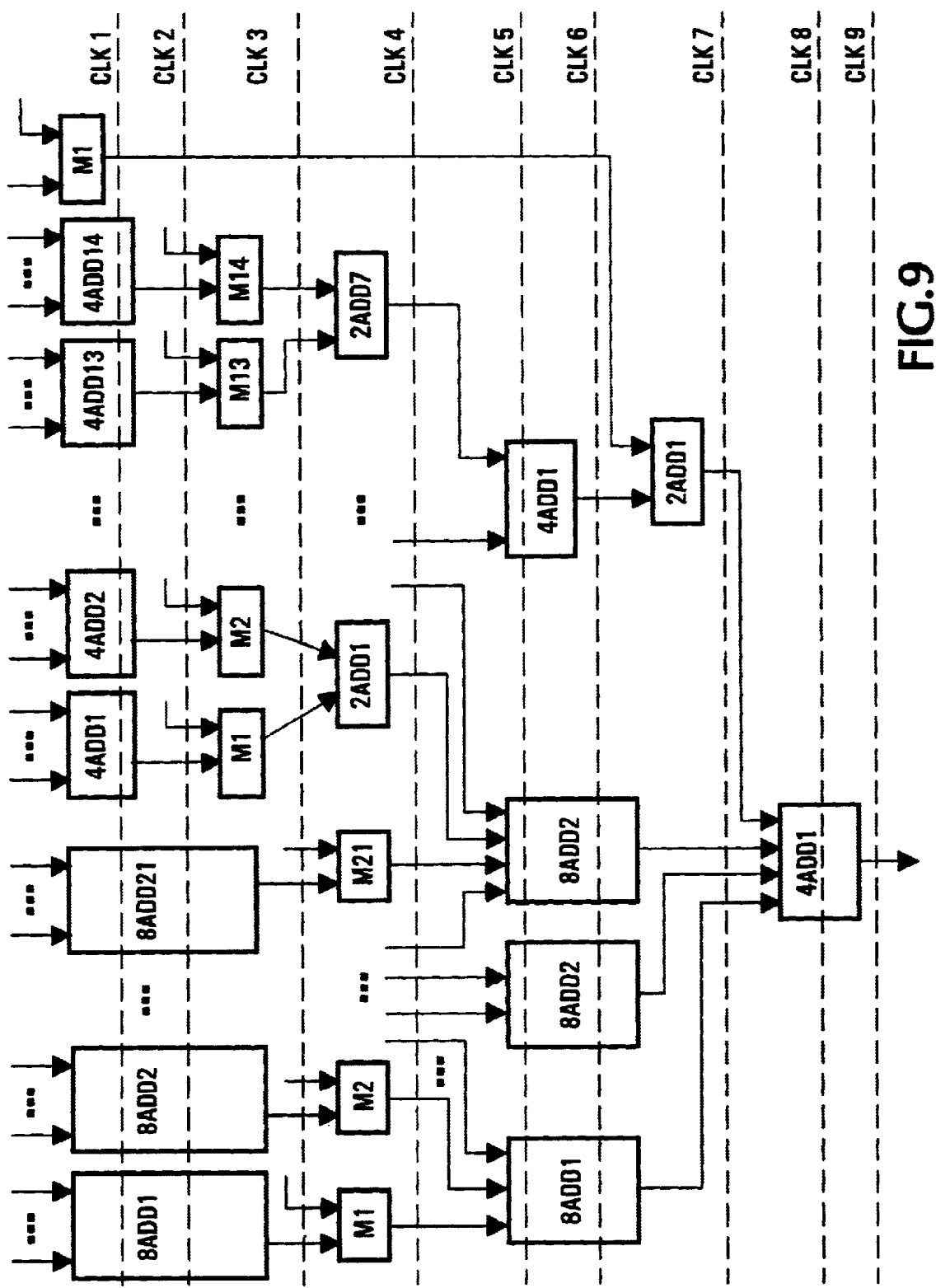
FIG. 9 shows a block diagram of one embodiment of a 15×15 symmetrical filter, in accordance with the invention.

From the expression for $y_{i,j}$, discussed in detail above, it can be deduced that optimum speed performance can be achieved by exploiting the underlying data parallelism with fourteen parallel 4-input adders, twenty-one parallel 8-input adders and twenty-one multipliers. An example is shown in FIG. 9.

The above discussion has presented few examples only. However, the same methodology is applicable for any N×N separable symmetric filters where N is an odd integer.

These digital filters may be used in several different digital imaging applications, including printing and video. One example may be digital document image processing. Additionally, these filters can be used in implementation of convolution-based wavelet transforms, which is the basis of many advanced image compression algorithms. For example, the upcoming still picture compression standard JPEG 2000 is based on Discrete Wavelet Transforms. The interesting point is that there are multiple number of wavelet filters proposed to do the discrete wavelet transform. The proposed filtering methodology can easily be adopted to compute all these filtering based Discrete Wavelet Transform.

Thus, although there has been described to this point a particular embodiment for a method and apparatus for an optimal symmetric digital filter, it is not intended that such specific references be considered as limitations upon the scope of this invention except in-so-far as set forth in the following claims.

What is claimed is:

1. A symmetric separable digital filter having the dimensions N rows by N columns, comprising:
   a predetermined number of 8-input adders operable to receive samples of an input signal;
   a predetermined number of 4-input adders operable to receive samples of an input signal; and
   a predetermined number of parallel multipliers, wherein the parallel multipliers are operable to receive partial sum output signals from the 8-input adders and the 4-input adders, and multiply the partial sums by coefficients of the digital filter, filtering the input signal.

2. The symmetrical digital filter of claim 1, wherein the predetermined number of 8-input adders is equal to the quantity N minus 1 multiplied by the quantity N minus three, resulting in a multiplicand that is then divided by 8.

3. The symmetrical digital filter of claim 1, wherein the predetermined number of 4-input adders is equal to the number N minus 1.

4. The symmetrical digital filter of claim 1, wherein the predetermined number of parallel multipliers is equal to the larger of the predetermined number of 8-input adders and the predetermined of 4-input adders.

5. The symmetrical digital filter of claim 1, wherein N is equal to 3, the predetermined number of 4-input adders is equal to 2, the predetermined number of multipliers is equal to 2 and predetermined number of 8-input adders is zero.

6. The symmetrical digital filter of claim 1, wherein N is equal to 5, the predetermined number of 4-input adders is equal to 4, the predetermined number of 8-input adders is equal to 1, and the predetermined number of multipliers is equal to 4.

7. The symmetrical digital filter of claim 1, wherein N is equal to 7, the predetermined number of 4-input adders is equal to 6, the predetermined number of 8-input adders is equal to 3, and the predetermined number of multipliers is equal to 6.

8. The symmetrical digital filter of claim 1, wherein N is equal to 9, the predetermined number of 4-input adders is equal to 8, the predetermined number of 8-input adders is equal to 6, and the predetermined number of multipliers is equal to 8.

9. The symmetrical digital filter of claim 1, wherein N is equal to 11, the predetermined number of 4-input adders is equal to 10, the predetermined number of 8-input adders is equal to 10, and the predetermined number of multipliers is equal to 10.

10. The symmetrical digital filter of claim 1, wherein N is equal to 13, the predetermined number of 4-input adders is equal to 12, the predetermined number of 8-input adders is equal to 15, and the predetermined number of multipliers is equal to 15.

11. The symmetrical digital filter of claim 1, wherein N is equal to 15, the predetermined number of 4-input adders is equal to 14, the predetermined number of 8-input adders is equal to 21, and the predetermined number of multipliers is equal to 21.

12. A symmetric digital filter having the dimensions N rows by N columns, comprising:
   a predetermined number of 8-input adders operable to receive samples of an input signal, wherein the 8-input adders arc comprised of four 2-input adders;
   a predetermined number of 4-input adders operable to receive samples of an input signal, wherein the 4-input adders are comprised of two 2-input adders; and
   a predetermined number of parallel multipliers, wherein the parallel multipliers are operable to receive output signals from the 8-input adders and the 4-input adders, and multiply the partial sums by coefficients of the digital filter, thereby applying the digital filter to the input signal.

13. The symmetric digital filter of claim 12, wherein N is equal to three, the predetermined number of 8-input adders is equal to zero, the predetermined number of 4-input adders is equal to two, and two 2-input adders are used.

14. The symmetric digital filter of claim 12, wherein N is equal to five, the predetermined number of 8-input adders is equal to one, the predetermined number of 4-input adders is equal to four, and twelve 2-input adders are used.

15. The symmetric digital filter of claim 12, wherein N is equal to seven, the predetermined number of 8-input adders is equal to three, the predetermined number of 4-input adders is equal to six, and twenty four 2-input adders are used.

16. The symmetric digital filter of claim 12, wherein N is equal to nine, the predetermined number of 8-input adders is equal to six, the predetermined number of 4-input adders is equal to eight, and forty 2-input adders are used.

17. The symmetric digital filter of claim 12, wherein N is equal to eleven, the predetermined number of 8-input adders is equal to ten, the predetermined number of 4-input adders is equal to ten, and sixty 2-input adders are used.

18. The symmetric digital filter of claim 12, wherein N is equal to thirteen, the predetermined number of 8-input adders is equal to fifteen, the predetermined number of 4-input adders is equal to twelve, and eighty four 2-input adders are used.

19. The symmetric digital filter of claim 12, wherein N is equal to fifteen, the predetermined number of 8-input adders is equal to twenty one, the predetermined number of 4input adders is equal to fourteen, and one hundred and twelve 2-input adders are used.

20. A method of executing a digital filter having dimensions N rows by N columns, the method comprising:

allocating input signals of square corner elements and square middle elements to inputs of 4-input adders;

allocating input signals of any distance corner elements to inputs of at least one 8-input adder;

allocating an input signal for a center element and a center filter coefficient to a multiplier;

multiplying outputs of the 4-input adders with their corresponding filter coefficients resulting in a set of multiplicands;

adding pairs from the set of multiplicands, resulting in partial results;

multiplying any outputs from the 8-input adders to their corresponding filter coefficients, resulting in additional partial results; and adding partial results until a single output remains, wherein the single output is a filtered output.

21. The method of claim 20, wherein N is less than or equal to 5 and there are no distance corner elements.

22. The method of claim 20, wherein N is greater than 5 and there are distance corner elements.

\* \* \* \* \*

UNITED STATES PATENT AND TRADEMARK OFFICE
CERTIFICATE OF CORRECTION

PATENT NO. : 6,678,708 B1
DATED : January 13, 2004
INVENTOR(S) : Acharya

It is certified that error appears in the above-identified patent and that said Letters Patent is hereby corrected as shown below:

Column 14,
Line 8, "2 and predetermined" should read -- 2 and the predetermined --.
Line 43, "adders arc comprised" should read -- adders are comprised --.

Column 15,
Line 14, "of 4input adders" should read -- of 4-input adders --.

Signed and Sealed this

Sixteenth Day of November, 2004

JON W. DUDAS
*Director of the United States Patent and Trademark Office*